US005225833A

United States Patent [19]

Fisher et al.

[11] Patent Number: 5,225,833

[45] Date of Patent: Jul. 6, 1993

[54] CHARACTER ENCODING

[75] Inventors: Edward G. Fisher, Hudson, N.H.; Peter D. Gilbert, Leominster, Mass.

[73] Assignee: Digital Equipment Corporation, Maynard, Mass.

[21] Appl. No.: 425,848

[22] Filed: Oct. 20, 1989

[51] Int. Cl.$^5$ .............. H03M 7/00

[52] U.S. Cl. .............. 341/90; 341/106

[58] Field of Search .............. 341/90, 106, 99; 400/104, 105, 110, 111

[56] References Cited

U.S. PATENT DOCUMENTS

| | | | |
|---|---|---|---|
| 3,971,014 | 7/1976 | Korowitz | 341/106 X |
| 4,415,766 | 11/1983 | Hyder | 341/90 X |
| 4,597,057 | 6/1986 | Snow | 341/106 X |
| 4,612,532 | 9/1986 | Bacon et al. | 341/106 X |
| 4,868,570 | 9/1989 | Davis | 341/106 |

FOREIGN PATENT DOCUMENTS 0294950 12/1988 European Pat. Off. .

OTHER PUBLICATIONS

Mayfield, "8-bit character encoding for multiple languages", IBM Technical Disclosure Bulletin, vol. 26, No. 2, p. 537 (Jul. 1983).

"Special character sort sequence", IBM Technical Disclosure Bulletin, vol. 32, No. 1, pp. 5–6 (Jun. 1989).

*Primary Examiner*—Sharon D. Logan

*Attorney, Agent, or Firm*—Fish & Richardson

[57] ABSTRACT

A method of encoding the characters of a character set, wherein the characters have a plurality of attributes (e.g., base, diacritical, and case), and wherein each attribute may have a plurality of values. The method comprises the steps of: dividing a multi-digit code into a plurality of parts, assigning each attribute to a different part, and, within each part, assigning a different numerical code to each different value of the attribute.

30 Claims, 1 Drawing Sheet

CHARACTER ENCODING

BACKGROUND OF THE INVENTION

The invention relates to encoding characters.

Many ways exist to encode characters. For example, the American Standard Code for Information Interchange (ASCII) and the Multinational Character Set (MCS) assign a binary code to each character where the value of the code is the position of the character in an arbitrarily ordered character set. ASCII, for instance, includes alphabet letters ("A–Z" and "a–z"), numerals ("0–9"), and other characters (e.g., "!", "#", "$", "%", or "&"). Each character has a position in the set the value of which is the character's code. The characters "A", "B", and "C", for example, are in positions 65, 66, and 67, and are assigned codes 1000001, 1000010, and 1000011, respectively.

MCS, on the other hand, subsumes the ASCII character set and further includes so-called "multinational" characters. These multinational characters include phonetic characters, such as ligatures (e.g., "æ") and characters having diacritical markings (e.g., "Â", "È", and "O"), as well as other characters such as "¡" and "¿". Again, each character has a position in the set the value of which is the character's code. The characters "Á", "Â", and "Ã", for example, are in positions 193, 194, and 195, and are assigned codes 11000001, 11000010, and 11000011, respectively.

The codes in ASCII and MCS are often used to compare two characters from the same character set. A first character is greater than, less than, or equal to a second character if the value of its code is greater than, less than, or equal to the value of the code of the second character. For example, in MCS, "A" is less than "Á" because 1000001 is less than 11000001.

The codes in ASCII and MCS are also used to compare strings of two or more characters from the same character set. To compare a first string and a second string, the character comparison described above is applied to a character in the first string and its corresponding character in the second string. The comparisons are repeated on successive corresponding characters until a character from the first string is greater than or less than its corresponding character in the second string, an operation referred to as a "character by character" comparison.

For example, a character by character comparison of the strings, "canoes" and "canons" indicates that "canoes" is less than "canons" because although the codes for "c", "a", "n", and "o" are equal, the value of the code for "e" (01100101) is less than the value of the code for "n" (01101110). Note, however, that a character by character comparison ends once unequal characters are found. In the present example, the character "s" is never compared. This aspect of the character by character comparison can produce undesired results when strings contain a mixture of uppercase characters, lowercase characters, and phonetic characters. For example, in MCS, a character by character comparison indicates that "McDougal" is less than "Mcdonald" and that "Muttle" is less "Müller". One method used to compare strings that contain a mixture of uppercase, lowercase, and phonetic characters is the "three pass comparison" described below.

In the three pass comparison method, the steps of the first pass are to 1) convert the characters of two strings to all uppercase characters, 2) reduce any phonetic characters to their base character, and 3) perform a character by character comparison on the remaining characters. For example, "Muller" and "Müller" become "MULLER" and "MULLER", "MacDonald" and "Macdonald" become "MACDONALD" and "MACDONALD", "MacDougal" and "MacDougal" become "MACDOUGAL" and"MACDOUGAL", and "Muttle" and "Müller" become "MUTTLE" and "MULLER". If the character by character comparison returns a value of equal, then the method proceeds to the second pass. For example, "MULLER"="MULLER", "MACDONALD"="MACDONALD", and "MACDOUGAL"="MACDOUGAL". Otherwise, the comparison returns either a result of greater than or less than and the method ends. For example, "MUTTLE">"MULLER".

The steps of the second pass are to 1) convert the characters of the two strings to all uppercase characters with phonetic characters left in, and 2) compare the strings character by character. For example, "Muller" and "Müller" become "MULLER" and "MÜLLER", "MacDonald" and "Macdonald" become "MACDONALD" and "MACDONALD", and "MacDougal" and "MacDougal" become "MACDOUGAL" and "MACDOUGAL". If the comparison returns that the strings are equal, then the method proceeds to the third pass. For example, "MACDONALD"="MACDONALD" and "MACDOUGAL"="MACDOUGAL". Otherwise, the comparison returns a result of greater than or less than and the method ends. For example, "MULLER"<"MÜLLER".

The steps of the third pass are to 1) convert the strings to mixed uppercase and lowercase characters with phonetic characters, and 2) compare the strings character by character. For example, "MacDonald" and "Macdonald" become "MacDonald" and "Macdonald", and "MacDougal" and "MacDougal" become "MacDougal" and "MacDougal". If the comparison returns a result of equal, the method ends. For example, "MacDougal"="MacDougal". Otherwise, if the comparison returns a result of greater than or less than, the method ends. For example, "MacDonald">"Macdonald".

SUMMARY OF THE INVENTION

In general the invention features a method of encoding the characters of a character set, wherein the characters have a plurality of attributes (e.g., base, diacritical, and case), and wherein each attribute may have a plurality of values. The method comprises the steps of: dividing a multi-digit code into a plurality of parts, assigning each attribute to a different part, and, within each part, assigning a different numerical code to each different value of the attribute.

In preferred embodiments, the length, i.e., the number of digits, of each part varies from character to character in the character set, depending on the number of different values of an attribute; the total length of the code is the same for all characters in the character set; and the attributes comprise a base attribute, a diacritical attribute, and a case attribute. Depending on the number of diacritical values for a particular base attribute, the length of the part assigned to the diacritical attribute is longer than the length of the part assigned to the base attribute. The method is used to encode each character in a string of characters. Parts of the code corresponding to the same attribute from each character in the string are concatenated, thereby producing for each attribute a segment of concatenated parts from each character, and the segments are themselves concatenated to form an overall concatenated code representing the character string, with the order of concatenation such that the segment corresponding to the attribute of primary significance in the collating sequence has the highest order position in the overall concatenated code and remaining segments are ordered in accordance with descending significance in the collating sequence. A field of null characters can be interposed between two concatenated segments of different attributes to prevent a collating sequence error arising from overlap of the two segments. Compare operations are performed on the overall concatenated code to determine the relative position of two character strings in a prescribed collating sequence; the compare operation constitutes a single comparison of the concatenated segments. Particular codes for primary and secondary attributes (e.g., base and diacritical attributes) are selected by counting, for each value of the primary attribute, the number of different values of the secondary attribute, and the length of the part of the code assigned to the secondary attribute is varied depending on the count (e.g., enough bits are provided to represent all possible values of the attribute).

An advantage of the invention is that a compare operation on two character strings is accomplished in one step. Another advantage is that a user may vary the collating sequence (i.e., the sorting order) as desired, without being constrained by the arbitrary order of the standard code (e.g., MCS code) for the characters. Thus, if it was desired, for example, to have "c" come after "d" instead of before it in a particular alphabet, the fact that the standard code used to represent the character (e.g., MCS) has "c" coming before "d" would not be a constraint. Still a further advantage is that two-letter characters, e.g., "ch" and "ll" of Spanish, can be treated as single characters in establishing a collating sequence.

Other features and advantages of the invention will be apparent from the following description of a preferred embodiment and from the claims.

DESCRIPTION OF THE PREFERRED EMBODIMENT

Figure 1:
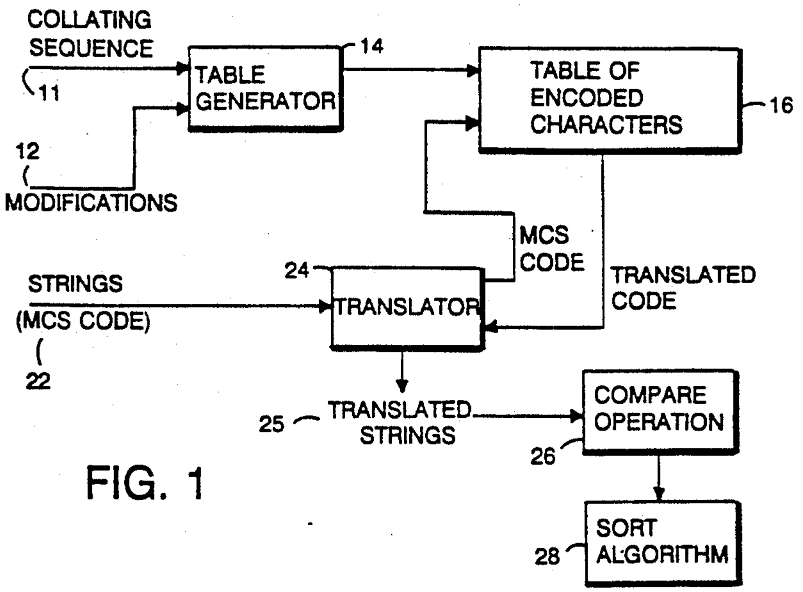
FIG. 1 is a block diagram of the components of an encoding system according to the present invention.

The invention involves encoding, comparing, and relating characters such as those found in a text file or database. Such a character has a number of possible attributes including a base character, a diacritical marking, and a case, each of which has a one or more possible values. The value of the base attribute can be, for example, "A", "B", or "C". The value of the diacritical attribute can be, for example, a circumflex " ˆ ", grave accent " ˋ ", or tilde "~". And the value of the case attribute can be uppercase, lowercase, or a combination of uppercase and lowercase, e.g., as in Spanish characters "CH", "ch", "Ch", "cH". For example, the character "à" has a base the value of which is "A", a diacritical the value of which is a grave accent " ˋ ", and a case the value of which is lowercase. A description of the code generated according to the attributes of a character follows.

In a first aspect of the invention, a character is encoded according to its attributes. A code for a character is divided into parts and each part of the code is assigned to an attribute of the character. In the description below, the code for a character is nine bits long and is divided into three variable length parts: a base part, a diacritical part, and a case part, which are assigned to the base attribute, diacritical attribute, and case attribute of the character, respectively. For example, the character "a" has a base part the value of which is 00110, a diacritical part the value of which is 000, and a case part the value of which is 0. Table 1 shows a sampling of characters and their codes.

TABLE 1

| Character | Base Part | Diacritic Part | Case Part |
|---|---|---|---|
| a | 00110 | 000 | 0 |
| c | 0011101 | 0 | 0 |
| ç | 0011101 | 1 | 0 |
| C | 0011101 | 0 | 1 |
| E | 010 | 00000 | 1 |
| È | 010 | 00001 | 1 |
| É | 010 | 00010 | 1 |
| Ê | 010 | 00011 | 1 |
| Ë | 010 | 00100 | 1 |
| e | 010 | 00000 | 0 |
| è | 010 | 00001 | 0 |
| é | 010 | 00010 | 0 |
| ê | 010 | 00011 | 0 |
| ë | 010 | 00100 | 0 |
| o | 1000 | 1000 | 0 |
| ô | 1000 | 1011 | 0 |
| p | 10010000 | | 0 |
| t | 10110000 | | 0 |

Referring to Table 1 and as noted above, the parts of a code vary in length. For example, the base part of the code for "t" is eight bits long, while the base part of the code for "e" is only three bits long. This is done to account for the variance in the number of possible values an attribute has. For example, "e" has many possible values in its diacritical attribute. Thus, the lengths of the parts assigned to the other attributes of "e" are shortened to provide enough bits in the part assigned to the diacritical attribute to represent each possible value.

Further, any characters that have the same value in an attribute can have the same value in the part of their code assigned to that attribute. For example, "E" and "É" have the same values in their base and case attributes, but do not have the same value in their diacritical attribute. Therefore, "E" and "É" have the same value in their base parts (010) and case parts (1), but do not have the same value in their diacritical parts. The system and method used to encode characters and create a table similar to Table 1 are described next in connection with FIG. 1.

Referring to FIG. 1, an encoding system 10 includes a collating sequence 11 provided by a particular character set, e.g., MCS, and a list of modifications 12 provided by the user to alter the collating sequence 11. As described in detail below, a table generator 14 uses the collating sequence 11 and the modifications 12 to produce a table of encoded characters 16 similar to Table 1. The table of encoded characters 16 further includes codes for special case characters such as "ch" and "ll" which are considered one character in Spanish and "ß" in German which is considered as two characters "ss". These special case characters are described in detail later in connection with various relational operations. However, first a description of the collating sequence 11 and the modifications 12 is provided.

The user modifies the sequence 11 of a character set by defining in the modifications 12 a number of attribute classes each of which corresponds to one of the attributes discussed above. All characters having one value for an attribute fall into one attribute class, while all characters having another value for the selected attribute fall into another attribute class. For example, "A", "a", "À", "à", "Â", and "â" all have a base attribute value of "A" and fall into one attribute class, while "B" and "b" have a base attribute value of "B" and fall into another attribute class. Within each attribute class, there are one or more attribute values. For example, the "A" attribute class has one base attribute value, four diacritical attribute values, and two case attribute values. The method of assigning the attribute values is described below in connection with the flowchart of FIG. 2 with reference to the components of FIG. 1.

Figure 2:
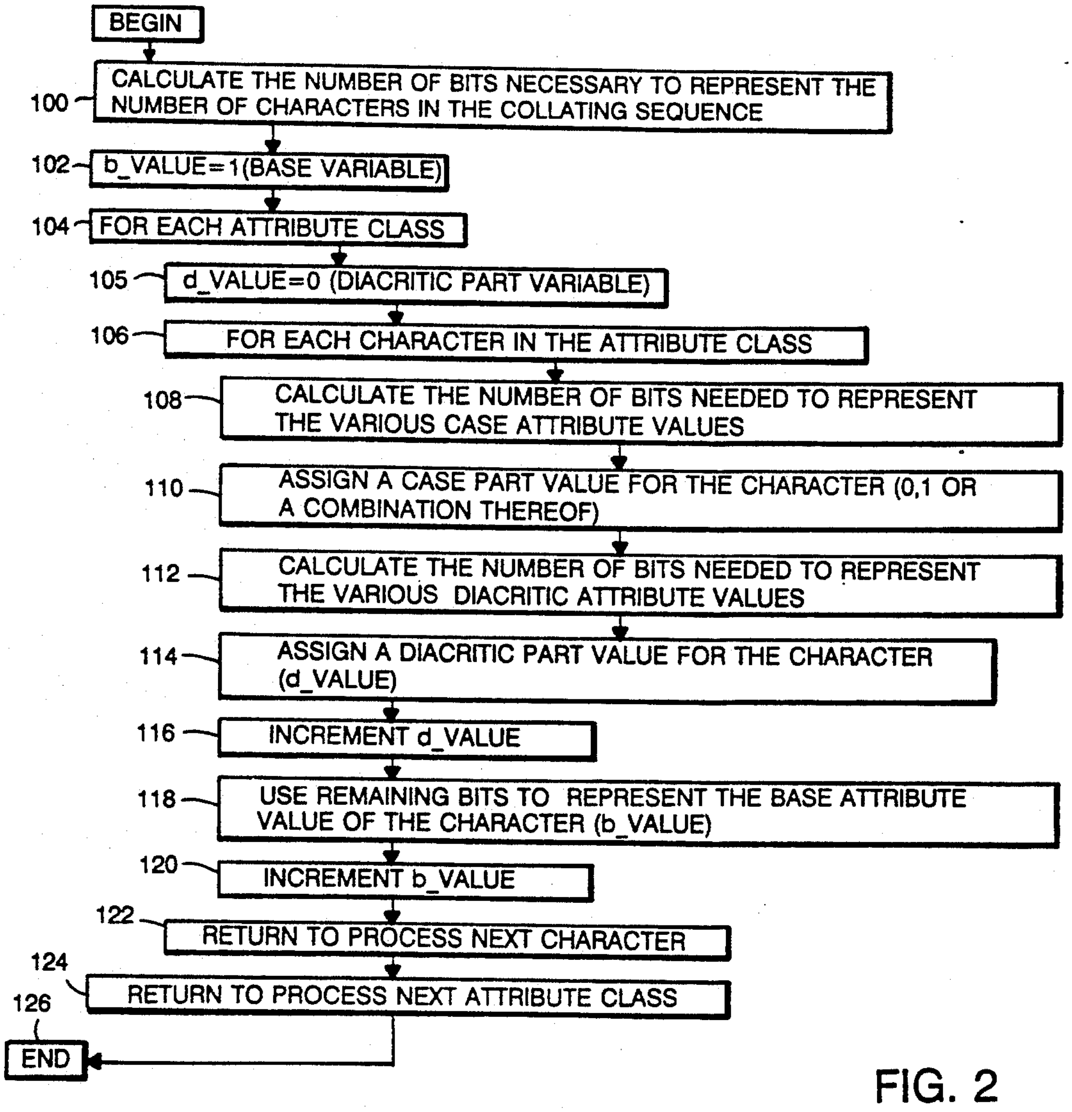
FIG. 2 is a flowchart of the general steps followed in assigning a value to a part.

In preparation for the steps shown in FIG. 2, the table generator 14 reads the modifications 12 and sets up the attribute classes. That is, for each character in the character set, the table generator 14 adds the character to any and all attribute classes to which it belongs, and increments the number of characters in those attribute classes by one.

Referring to FIG. 2, once all of the characters in the character set are read, the table generator 14 calculates the length of the code for a character (step 100), i.e., the length needed to represent the number of characters in the collating sequence 11. For example, up to 512 characters can be represented in 9 bits. The first attribute class to be processed is that of the first character in the collating sequence. Therefore, the variable representing the first base part value (b_value) is initialized to 1 (step 102). Note at this point that it is often desirable to design the overall code in such a manner that several combinations of bits in a particular attribute may not be used. For example, if there are five diacriticals associated with an "A", three bits are required for the diacritical part. Since the three bits can represent up to eight diacritical parts, three bit combinations are not used.

Next, for each attribute class (step 104) and each character in that attribute class (step 106), the table generator 14 calculates a value for the parts assigned to the character's various attribute. First, the table generator 14 calculates the number of bits needed to represent the various case attribute values (step 108). Note that in step 105, the variable representing the value of the diacritic part (d_value) is initialized to 0 before processing each character.

For each character in the attribute class, the table generator 14, calculates the number of bits needed to represent the various case attribute values (step 108) and assigns a case part value for the character (step 110).

To assign a value for the diacritic part of the character, the table generator 14 calculates the number of bits needed to represent the various diacritic attribute values (step 112), assigns a diacritic part value for the character equal to d_value (step 114), and increments the d_value variable (step 116). For example, more than one value for the diacritical attributes exists in the "A" attribute class. Therefore, the diacritic part values for the characters in the "A" attribute class are calculated depending on when the character was added to the attribute class. Next, to assign a value for the base part of the character, the table generator 14 uses the remaining bits to represent the base attribute value of the character, i.e., b_value, (step 118) and increments the b_value (step 120).

Having assigned the part values for the various attributes of the character, the table generator 14 returns to step 106 to process the next character in the attribute class (step 122). If there are no other characters in the attribute class, the table generator 14 returns to step 104 to process the next attribute class (step 124). If there are no other attribute classes, the process ends (step 126).

In another aspect of the invention, once the table 16 is generated, a pair of character strings 22 can be compared. The strings 22 (represented by a standard code, e.g., MCS) are submitted to a translator 24 which applies the strings to the table 16 to generate translated strings 25. The translated strings 25 are then concatenated in the translator 24 to permit a one step compare operation.

First, for each string, the base parts of the codes of each character are concatenated with one another. For example, given the character set in Table 1, the base parts of the strings "côte" and "cote" are concatenated as follows.

```
c      ô  t      e
0011101100010110000010

c      ô  t      e
0011101100010110000010
```

Next, the base parts are then concatenated with a five bit null character pad as shown below. (The null character pad ensures that strings of different length are compared properly as shown in a later example.)

```
c      ô  t      e (pad)
001110110001011000001000000

c      o  t      e (pad)
001110110001011000001000000
```

Next, the base parts and null character pad are concatenated with the diacritiç parts of the characters, which are concatenated with one another.

```
c      ô  t      e (pad) co   e
0011101100010110000010000000101100000

c      o  t      e (pad) co   e
0011101100010110000010000000100000000
```

Finally, the base parts, null character pad, and diacritic parts are concatenated with the case parts of the characters, which are concatenated with one another. The translated strings are:

```
c      ô  t      e (pad) co   e    cote
001110110001011000001000000010110000000000

c      o  t      e (pad) co   e    cote
001110110001011000001000000010000000000000
```

As mentioned above the null character pad ensures that strings of different length are compared properly. Errors in comparing translated strings can arise when concatenated parts of an attribute, i.e., a segment of the translated string, overlap with segments produced from another attribute, specifically in cases where two strings of different length are equal up to the point where one of the strings ends. In such cases, the null character pad prevents the base parts of the longer string from being compared with the diacritical or case parts of the shorter string. For example, compare the translated strings "c" and "ca" *without* the null character pad:

```
    ç           ç ç
    0 0 1 1 1 0 1 1 0

ç         a        ç a    ç a
0 0 1 1 1 0 1 0 0 1 1 0 1 0 0 0 0 0
```

In this example, the diacritical part of character "ç" in the string "ç" corresponds with the base part of the character "a" in the string "ça". The result of comparing the strings is "ç" > "ça", which is opposite of that intended, i.e., the string "ç" should be less than, *not* greater than the string "ça". To prevent such a result, the null character pad is concatenated between the base parts and diacritical parts of every string. The null character pad and its application to the above example are discussed below.

The null character pad is composed entirely of zeros, which ensures that the pad is always less than any base part with which the pad is compared. (Note that no base part is composed entirely of zeros or has leading zeros in excess of the number of zeros in the null character pad.) Thus, in cases where two strings of different length are equal to the point where one of the strings ends, the null character pad in the shorter string corresponds with the base part of the next character in the longer string, which effectively prevents the shorter string from being greater than the longer string. For example, compare the strings "c" and "ca" *with* the null character pad:

```
     ç          (pad)   ç ç
     0 0 1 1 1 0 1 0 0 0 0 0 1 0

ç         a     (pad)   ç a     ç a
0 0 1 1 1 0 1 0 0 1 1 0 0 0 0 0 0 1 0 0 0 0 0 0
```

In this example, the null character pad for the string "ç" is compared with the base part for the character "a" in the string "ça". The result is "ç" < "ça" as intended.

To complete the translation example, the following strings are translated:

| | | |
|---|---|---|
| cot | = | 0011101 1000 10110000 00000 0 1000 000 |
| cope | = | 0011101 1000 10010000 010 00000 0 1000 00000 0000 |
| cat | = | 0011101 00110 10110000 00000 0 000 000 |
| Cope | = | 0011101 1000 10010000 010 00000 0 1000 00000 1000 |
| Cot | = | 0011101 1000 10110000 00060 0·1000 100 |

Referring again to FIG. 1, the translator 24 submits translated strings 25 similar to those above to a compare operation 26, which accepts two operands and a length and returns a result of less than, greater than, or equal. A sort algorithm 28 then takes the result and orders the strings 22 accordingly. For example, the strings translated above are sorted as:

| | | |
|---|---|---|
| çat | = | 00111010011010110000000000000000 |
| cope | = | 00111011000100100000100000010000000000000 |
| Cope | = | 00111011000100100000100000010000000001000 |
| cot | = | 00111011000101100000000001000000 |
| Cot | = | 00111011000101100000000001000100 |

-continued

| | | |
|---|---|---|
| côte | = | 0011101100010110000010000000100000000000 |

In another aspect of the invention, various relational operations such as "MATCHING", "CONTAINING", and "STARTING WITH" use the table of encoded characters 16 to compare and match strings and substrings of characters. These operations are useful, for example, when searching a text file or database for a certain string of characters. Of particular interest here is the matching of the so-called special case characters mentioned earlier in connection with the table of encoded characters 16.

Each relational operation returns a value of true or false depending on the value of the codes for the characters in the strings being compared and matched. The "MATCHING" operation returns a value of true if a first string matches any substring of a second string. The "CONTAINING" operation returns a value of true if a first string is found within a second string. The "STARTING WITH" operation returns a value of true if the initial characters in a first string match the initial characters in a second string.

Performing relational operations on the characters discussed so far is fairly straightforward and uses the character by character comparison described above, i.e., successive single characters in the first string are compared with corresponding single characters in the second string. However, special case characters such as "ch", "ll", and ß must be treated differently. For example, the operation "STARTING WITH C" should not return a value of true for "chile" in Spanish since "ch" is one character in Spanish.

In order to compare special case characters, then, the relational operations first attempt to locate each character in a string in a section of the table of encoded characters 16 that contains special case characters such as "ch". A table of encoded characters for the Spanish character set is attached as an appendix. (Note that the table relates directly to the source code in the attached microfiche appendix. Therefore, the parts values are read right to left for reasons discussed below in connection with the source code. However, the principles of operation remain the same.) For example, using the Spanish table of encoded characters shown in the attached appendix, if the operation "STARTING WITH T" encounters a "T" in a string, it checks the section of special cases to see if "T" is the first character in any special case character. Since "T" is not the first character in any special case character, the operation locates "T" in the section of the table 16 that contains non-special case characters and uses the code found there.

On the other hand, if the operation "STARTING WITH C" encounters a "C" in a string, it checks the section of special cases to see if "C" is the first character in any special case character. Since "C" is the first character in the special case character "CH", the operation checks to see if the next character in the string is an "H". If so, the operation uses the code for "CH" found in the section of special case characters in the table 16. However, if the "C" was not followed by an "H", then the operation locates "C" in the section of the table that contains non-special case characters and uses the code found there. For example, "STARTING WITH C" returns a value of false for "chile" and returns a value of true for "casa".

Pursuant to CFR 37 §1.96 (b), the source code that embodies the table generator 14 is attached as a microfiche appendix containing 62 frames and is incorporated herein by reference. The programming language used is Bliss, (VAX Bliss-32 V4.3-808), a programming language of Digital Equipment Corporation, the specification of which is published and available from Digital as the *BLISS Language Reference Manual* AA-H275D-TK, May 1987. The source code was compiled using Bliss Compiler 4.3-808 on a VAX 8800 computer running under the VMS 5.2 operating system. Note that the architecture of the VAX computer considers the leftmost bit of a string to be the most significant bit of a byte. Therefore, the source code embodiment encodes characters so that they are read and concatenated from right to left. The order of bits in translated strings is then reversed before the strings are compared, an operation sometimes referred to as "flipping the bits". The methods of encoding and concatenation are discussed above in a left to right orientation for ease of reading and understanding.

Other embodiments are within the following claims.

We claim:

1. A method of encoding characters of a character set into codewords each one of which represents one of said characters, wherein each one of said characters has a plurality of attributes, and wherein each one of said attributes comprises one or more attribute classes, each character embodying one attribute class for each attribute, said method comprising the steps of:

for each character in said character set:

(a) defining the codeword that represents said character as having a plurality of codeword parts, (b) assigning to each one of said codeword parts one of said attributes, (c) for each one of said attributes, assigning to each attribute class thereof a numerical code that differs from numerical codes assigned to other classes of that attribute, and (d) assigning to each one of said codeword parts the numerical code of the attribute class embodied by said character for the attribute assigned to that part so that the numerical code assigned to said part defines said attribute class independently of numerical codes assigned to other parts of said codeword, whereby said codeword includes said numerical codes that differ according to the classes of the attributes of said character.

2. The method of claim 1 wherein each one of said parts has a length in said codeword that varies from character to character in said character set in accordance with a number of attribute classes that the attribute assigned to said part has.

3. The method of claim 2 wherein said codeword has a total length that is the same for all of the characters in said character set.

4. The method of claim 1 wherein said attributes comprise a base attribute, a diacritical attribute, and a case attribute.

5. The method of claim 4 further comprising, for characters which may embody any one of at least a predetermined number of attribute classes for the diacritical attribute, providing the codeword part assigned to the diacritical attribute with a greater length than the length of the codeword part assigned to the base attribute.

6. The method of claim 1 further comprising encoding each character in a string of characters belonging to said set using the steps of claim 1 to represent said string of characters as a series of said codewords.

7. The method of claim 6 further comprising the step of concatenating parts of said codewords that correspond to the same attribute from each character in said string, thereby producing for each said attribute a segment of concatenated parts from each of said codewords.

8. The method of claim 7 further comprising the steps of providing a predetermined collating sequence for said codewords, assigning primary significance to one of said attributes in said collating sequence, and concatenating said segments to form an overall concatenated code representing said character string, and performing said concatenating such that the segment corresponding to said attribute of primary significance in said collating sequence has a highest order position in said overall concatenated code and remaining ones of said segments are ordered in accordance with descending significance in said collating sequence.

9. The method of claim 8 wherein said attributes comprise a base attribute, a diacritical attribute, and a case attribute, and further comprising performing said concatenating so that the segment corresponding to said base attribute occupies said highest order position in said overall concatenated code, the segment corresponding to said diacritical attribute occupies a middle order position in said overall concatenated code, and the segment corresponding to the case attribute occupies a lowest order position in said overall concatenated code.

10. The method of claim 8 wherein each one of said parts has a length in said codeword that varies from character to character in said character set in accordance with a number of attribute classes that the attribute assigned to said part has.

11. The method of claim 10 further comprising interposing a field of null characters between two of said concatenated segments of concatenated parts, said field of null characters having a length sufficient to prevent a collating sequence error arising from overlap of the two segments.

12. The method of claim 1 or 5 further comprising the step of determining a relative position of two of said characters in a predetermined collating sequence based predominately on a comparison of said codewords for said characters.

13. The method of claim 8 further comprising the step of determining the relative position of two of said character strings in said collating sequence based predominately on a comparison of said overall concatenated codes for said character strings.

14. The method of claim 9 further comprising the step of determining the relative position of two of said character strings in said collating sequence based predominately on a comparison of said overall concatenated codes for said character strings.

15. The method of claim 2 wherein each one of said characters in said character set has a primary attribute and secondary attribute, said primary attribute and said secondary attribute each comprising a plurality of attribute classes, further comprising the steps of:

determining, for each one of said attribute classes of said primary attribute, the number of different said attribute classes of said secondary attribute, determining, for each one of said attribute classes of said primary attribute, the length of the codeword part assigned to said secondary attribute based on said number of different said attribute classes of said secondary attribute, and determining, for each one of said attribute classes of said primary attribute, the length of the codeword part assigned to said primary attribute based on said determined length of said secondary codeword part and a predetermined length of said codeword.

16. The method of claim 15 wherein said predetermined length of said codeword is the same for all of said characters in said character set, whereby a sum of the lengths of said parts is the same for all of said characters.

17. The method of claim 2 wherein the step of assigning said different numerical codes to said attribute classes of each of the attributes comprises assigning said codes so that the numerical order of attributes and attribute classes as represented by said codes corresponds to a predetermined collating sequence.

18. The method of claim 17 further comprising the step of deriving said predetermined collating sequence from a sequence of standard codes representing said characters and arranged in a standard collating sequence, and a set of sequence modifications for said character set.

19. The method of claim 4 wherein a single base attribute corresponds to a string of two of said characters and further comprising assigning a single one of said numerical codes to the part of said codeword to which said base attribute is assigned to represent said string of two characters in said codeword..

20. A method of comparing two strings of characters based on a desired collating sequence different from a numerical order of a set of standard codes that represent said characters, comprising the steps of:

assigning collating codes to said characters so that said collating codes have a numerical order that corresponds to said desired collating sequence, storing said collating codes in a translation table, applying said standard codes representing said characters in each one of said strings to said translation table, and causing said translation table to translate each one of said standard codes into the collating code that is assigned to said character represented by said standard code so that said translation table produces said collating codes for each one of said strings, and comparing said collating codes produced by said translation table for one of said strings with said collating codes produced by said translation table for the other one of said strings.

21. The method of claim 20 further comprising the steps of:

concatenating said collating codes produced by said translation table for the characters making up each one of said character strings, and said comparing step including comparing the concatenated collating codes produced by said translation table for one of said strings to the concatenated collating codes produced by said translation table for the other one of said strings.

22. The method of claim 21 wherein each one of said characters has a plurality of attributes, and each one of said attributes comprises one or more attribute classes, each character embodying one attribute class for each attribute, and wherein said step of assigning said collating codes to said characters includes, for each character comprising said collating code for said character from a plurality of parts, assigning to each part of said collating code one of said attributes, for each attribute, assigning to each attribute class a numerical code that differs from numerical codes assigned to other classes of that attribute, and assigning to each part of said collating code the numerical code of the attribute class embodied by said character for the attribute assigned to that part, whereby said collating code includes said numerical codes that differ according to the attribute class embodied by said character for each of the attributes of said character.

23. The method of claim 1 or 20 wherein said codes comprise binary numbers and the most significant bit of each of said codes is the rightmost bit and the least significant bit of each of said codes is the leftmost bit.

24. The method of claim 1 or 20 wherein said codes comprise binary numbers and the most significant bit of each of said codes is the leftmost bit and the least significant bit of each of said codes is the rightmost bit.

25. The method of claim 22 wherein said comparing step comprises one of the following steps:

a MATCHING operation in which a true value is returned if a first string matches any substring of a second string;

a CONTAINING operation in which a true value is returned if a first string is found within a second string; or a STARTING WITH operation in which a true value is returned if the initial characters in a first string match the initial characters in a second string.

26. The method of claim 22 wherein each one of said parts has a length in said collating code that varies from character to character in accordance with a number of values that the attribute assigned to said part has.

27. The method of claim 22 wherein said attributes comprise a base attribute, a diacritical attribute, and a case attribute.

28. The method of claim 22 further comprising the step of determining a relative position of two of said characters in said desired collating sequence based predominately on a comparison of said collating codes for said characters.

29. The method of claim 20 wherein said set of standard codes comprises ASCII codes.

30. The method of claim 20 wherein said set of standard codes comprises MCS codes.

* * * * *

CERTIFICATE OF CORRECTION

PATENT NO. : 5,225,833

DATED : July 6, 1993

INVENTOR(S) : Edward G. Fisher and Peter D. Gilbert

It is certified that error appears in the above-identified patent and that said Letters Patent is hereby corrected as shown below:

Title page, item [56] References Cited, U.S. PATENT DOCUMENTS, insert the following:

4,094,001 6/78 Miller . . . . . . . . . . . . . 364/900
4,425,626 1/84 Parmet . . . . . . . . . . . . . 364/900

Col. 1, line 24, "O" should be --Õ--.

Col. 6, line 43, the first part of the third equation should read:

c ô t e (pad)cô e
0011101100010110000010000000101100000

Col. 6, line 55, the first part of the fourth equation should read:

c ô t e (pad)cô e côte
001110110001011000001000000010110000000000

Col. 7, line 3, "c" should be --ç--.

UNITED STATES PATENT AND TRADEMARK OFFICE
CERTIFICATE OF CORRECTION

PATENT NO. : 5,225,833

DATED : July 6, 1993

INVENTOR(S) : Edward G. Fisher and Peter D. Gilbert

It is certified that error appears in the above-identified patent and that said Letters Patent is hereby corrected as shown below:

Col. 7, line 3, "ca" should be --ça--.

Col. 7, line 33, "c" should be --ç--.

Col. 7, line 33, "ca" should be --ça--.

Signed and Sealed this

Twenty-fifth Day of April, 1995

Attest:

BRUCE LEHMAN

Attesting Officer

*Commissioner of Patents and Trademarks*